United States Patent
Hayashi et al.

(10) Patent No.: US 7,995,646 B2
(45) Date of Patent: Aug. 9, 2011

(54) COMMUNICATION TEST CIRCUIT, COMMUNICATION INTERFACE CIRCUIT, AND COMMUNICATION TEST METHOD

(75) Inventors: Tetsuya Hayashi, Kawasaki (JP); Masanori Yoshitani, Kawasaki (JP); Tomokazu Higuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 971 days.

(21) Appl. No.: 11/898,658

(22) Filed: Sep. 13, 2007

(65) Prior Publication Data

US 2008/0063127 A1    Mar. 13, 2008

(30) Foreign Application Priority Data

Sep. 13, 2006  (JP) ................. 2006-248073

(51) Int. Cl.
*H04B 17/00* (2006.01)
(52) U.S. Cl. ...................... 375/226; 375/371
(58) Field of Classification Search .............. 375/224, 375/226, 324, 340, 354, 371, 373; 714/703, 714/704; 327/141, 165
See application file for complete search history.

(56) References Cited

U.S. PATENT DOCUMENTS

| | | | | |
|---|---|---|---|---|
| 5,515,404 A | * | 5/1996 | Pearce | 375/371 |
| 7,158,899 B2 | * | 1/2007 | Sunter et al. | 702/69 |
| 2004/0120392 A1 | * | 6/2004 | Searles et al. | 375/219 |

OTHER PUBLICATIONS

Patent Abstracts of Japan: Publication No. 2005-004653, Date of Publication: Jan. 6, 2005.
Patent Abstracts of Japan: Publication No. 2002-314516, Date of Publication: Oct. 25, 2002.

* cited by examiner

*Primary Examiner* — Dac Ha
(74) *Attorney, Agent, or Firm* — Staas & Halsey LLP

(57) ABSTRACT

A communication test circuit for allowing a tolerance test to be carried out in a general testing environment. The communication test circuit includes an adder and a second clock generation block. When an offset is input to the adder, the adder adds the offset to a phase adjustment signal for adjusting the phase of a clock signal for data detection and outputs the result to the second clock generation block. The second clock generation block outputs a second clock signal adjusted in accordance with the phase adjustment signal to which the offset has been added. Accordingly, a clock signal shifted in accordance with the offset from a natural clock signal along the time axis is generated at a test.

7 Claims, 5 Drawing Sheets

WAVEFORM OF RECEIVED
DATA SIGNAL

SUPERIMPOSED WAVEFORMS OF
RECEIVED DATA SIGNALS

WAVEFORM AT TEST

COMMUNICATION TEST CIRCUIT, COMMUNICATION INTERFACE CIRCUIT, AND COMMUNICATION TEST METHOD

CROSS-REFERENCE TO RELATED APPLICATIONS

This application is based upon and claims the benefits of priority from the prior Japanese Patent Application No. 2006-248073, filed on Sep. 13, 2006, the entire contents of which are incorporated herein by reference.

BACKGROUND OF THE INVENTION

1. Field of the Invention

It is related to communication test circuits, communication interface circuits, and communication test methods, and particularly to a communication test circuit for testing a communication interface circuit which restores a clock signal and detects data, from a received signal, the communication interface circuit, and a communication test method thereof.

2. Description of the Related Art

Since the performance of elements such as components included in computers and other information processing apparatuses has been enhanced in recent years, a high-speed serial interface that increases the data transfer speed between elements has become an item that must be incorporated.

A receiving circuit of the high-speed serial interface must detect data at a correct timing with respect to a sent signal. Therefore, the receiving circuit has a clock data recovery (CDR) circuit for carrying out a phase adjustment so that a correct clock can be generated from the received signal.

FIG. 5 is a block diagram showing an example structure of a conventional CDR circuit.

The conventional CDR circuit includes a data latch block 901, a boundary latch block 902, a boundary clock generation block 903, a data latch clock generation block 904, and a phase adjustment code generation block 905. The data latch block 901 operates according to a data latch clock signal generated by the data latch clock generation block 904 and latches data from an input differential signal. The boundary latch block 902 operates according to a boundary clock signal generated by the boundary clock generation block 903 and latches the boundary of the same input signal. The phase adjustment code generation block 905 compares the latch timing of the boundary latch block 902 and a data transition timing of the input signal to determine a phase lead or a phase lag, generates a phase adjustment code for bringing the boundary clock signal in phase with the actual input signal, and outputs the code to the boundary clock generation block 903. The phase of the boundary clock signal is adjusted accordingly. In addition, the data latch clock signal is adjusted to align its edge always with the midpoint between two edges of the boundary clock signal. One proposed clock restoration circuit (refer to Japanese Unexamined Patent Application Publication No. 2002-314516, FIG. 4, for instance) performs a stable clock restoration operation by shifting a boundary detection timing in advance or afterwards from the natural timing on purpose to change the boundary detection timing.

Standards for the receiving circuit of the serial interface define the maximum allowable jitter (noise measured in time). The receiving circuit must be able to receive a signal containing noise in the time domain up to the maximum allowable jitter. Therefore, the receiving circuit is factory-tested on jitter tolerance to check whether it can detect correct data from the received signal containing the maximum allowable jitter.

In the jitter tolerance test, the receiving circuit is given actual data bearing predetermined jitter. This can be implemented in some ways: A tester may generate an input signal carrying jitter and input the signal to the receiving circuit; an external component mounted on a test board may introduce jitter to an input signal. The test may be performed such that a jitter test circuit provided in the serial interface circuit (including input and output) introduces jitter to transmission data by giving jitter to a clock signal supplied to a sending circuit, and the transmission data is input to the receiving circuit (refer to Japanese Unexamined Patent Application Publication No. 2005-4653, FIG. 1, for instance).

A conventional jitter tolerance testing method is inappropriate for the high-speed serial interface that sends and receives high-speed serial data.

Generally, the signal transmission rate of the high-speed serial interface exceeds 1 Gbps and is expected to be higher in the future. For example, Peripheral Component Interconnect (PCI) Express performs 2.5-Gbps high-speed differential pulse transmission through a two-wire lane in one direction.

In a basic testing environment, high-speed serial data carrying jitter are generated, and the high-speed serial data is input to the receiving circuit for the test. A general LSI tester, however, does not have a function to generate jitter. If a tester is used, a tester that can measure jitter tolerance must be used. The tester that can measure jitter tolerance is so expensive that it would be hard to prepare a plurality of testers. It would be unfeasible to use those testers in a test in mass production. If the data transmission rate is high, a high precision would be required.

If jitter is introduced by an external component mounted on a test board, much effort would be needed to build the testing environment because the test board must be made in addition to the product. In addition, the test board would need complicated maintenance, and it would be hard to ensure the precision of the test board.

If jitter is introduced to the clock signal supplied to the sending circuit to input a signal bearing jitter into the receiving circuit, a test circuit for generating and adding jitter to the transmission data must be designed in addition to the product, requiring effort.

In view of the foregoing, it is an object of the present invention to provide a communication test circuit, a communication interface circuit, and a communication test method that allow a tolerance test such as a jitter tolerance test for mass-produced products to be carried out in a general environment.

SUMMARY OF THE INVENTION

According to the above object, there is provided a communication test circuit for testing a communication interface circuit that restores a clock signal from a received signal and detects data. This communication test circuit includes an adder for receiving a prescribed offset and a phase adjustment signal for adjusting a data detection timing at which the data is detected from the received signal, in accordance with the phase of the received signal, and for calculating an offset phase adjustment signal by adding the offset to the phase adjustment signal; and a clock generation block for receiving the offset phase adjustment signal calculated by the adder and for outputting the clock signal adjusted in accordance with the offset phase adjustment signal.

According to the above object, there is also provided a communication test circuit for testing a communication interface circuit that restores a first clock signal and a second clock signal from a received signal and detects data. This communication test circuit includes an adder for receiving a prescribed offset and a phase adjustment signal performing phase adjustment in accordance with the received signal, with respect to the first clock signal determining either one timing of a boundary detection timing for detecting a transition point of the data from the received signal and a data detection timing for detecting the data from the received signal and the second clock signal determining the other timing, and for calculating an offset phase adjustment signal by adding the offset to the phase adjustment signal; a first clock generation block for receiving the phase adjustment signal directly and for outputting the first clock signal with its phase adjusted in accordance with the phase adjustment signal; and a second clock generation block for receiving the offset phase adjustment signal obtained by adding the offset by the adder and for outputting the second clock signal with its phase adjusted in accordance with the offset phase adjustment signal.

According to the above object, there is also provided a communication interface circuit for restoring a first clock signal and a second clock signal from a received signal and detecting data. This communication interface circuit includes the following elements: a phase adjustment signal generation block for generating, in accordance with the received signal, a phase adjustment signal for adjusting, in accordance with variations in phase of the received signal, the first clock signal determining either one timing of a boundary detection timing for detecting a transition point of the data from the received signal and a data detection timing for detecting the data from the received signal, and the second clock signal determining the other timing; an adder for receiving the phase adjustment signal and a prescribed offset, and for calculating an offset phase adjustment signal by adding the offset to the phase adjustment signal; a first clock generation block for receiving the phase adjustment signal directly and for outputting the first clock signal with its phase adjusted in accordance with the phase adjustment signal; a second clock generation block for receiving the offset phase adjustment signal obtained by adding the offset by the adder and for outputting the second clock signal with its phase adjusted in accordance with the offset phase adjustment signal; and a data detection block for detecting the data from the received signal in accordance with the data detection timing determined by the second clock signal or the first clock signal.

According to the above object, there is also provided a communication test method for testing a communication interface circuit that restores a first clock signal and a second clock signal from a received signal and detects data. This communication test method includes the steps of an adder receiving a phase adjustment signal for specifying phase adjustment in accordance with the received signal, with respect to the first clock signal determining either one timing of the boundary detection timing for detecting a transition point of the data from the received signal and a data detection timing for detecting the data from the received signal and the second clock signal determining the other timing, also receiving a prescribed offset at a test, and calculating an offset phase adjustment signal by adding the offset to the phase adjustment signal; a first clock generation block receiving the phase adjustment signal directly and outputting the first clock signal with its phase adjusted in accordance with the phase adjustment signal; and a second clock generation block receiving the offset phase adjustment signal obtained by adding the offset by the adder and outputting the second clock signal with its phase adjusted in accordance with the offset phase adjustment signal, and shifting either the data detection timing or the boundary detection timing from the timing determined by the received signal.

The above and other objects, features and advantages will become apparent from the following description when taken in conjunction with the accompanying drawings which illustrate preferred embodiments of the present invention by way of example.

DESCRIPTION OF THE PREFERRED EMBODIMENTS

Embodiments of the present invention will be described below with reference to the drawings. The concept of the present invention applied to the embodiments will be described first, and then the embodiments will be described in detail.

Figure 1:
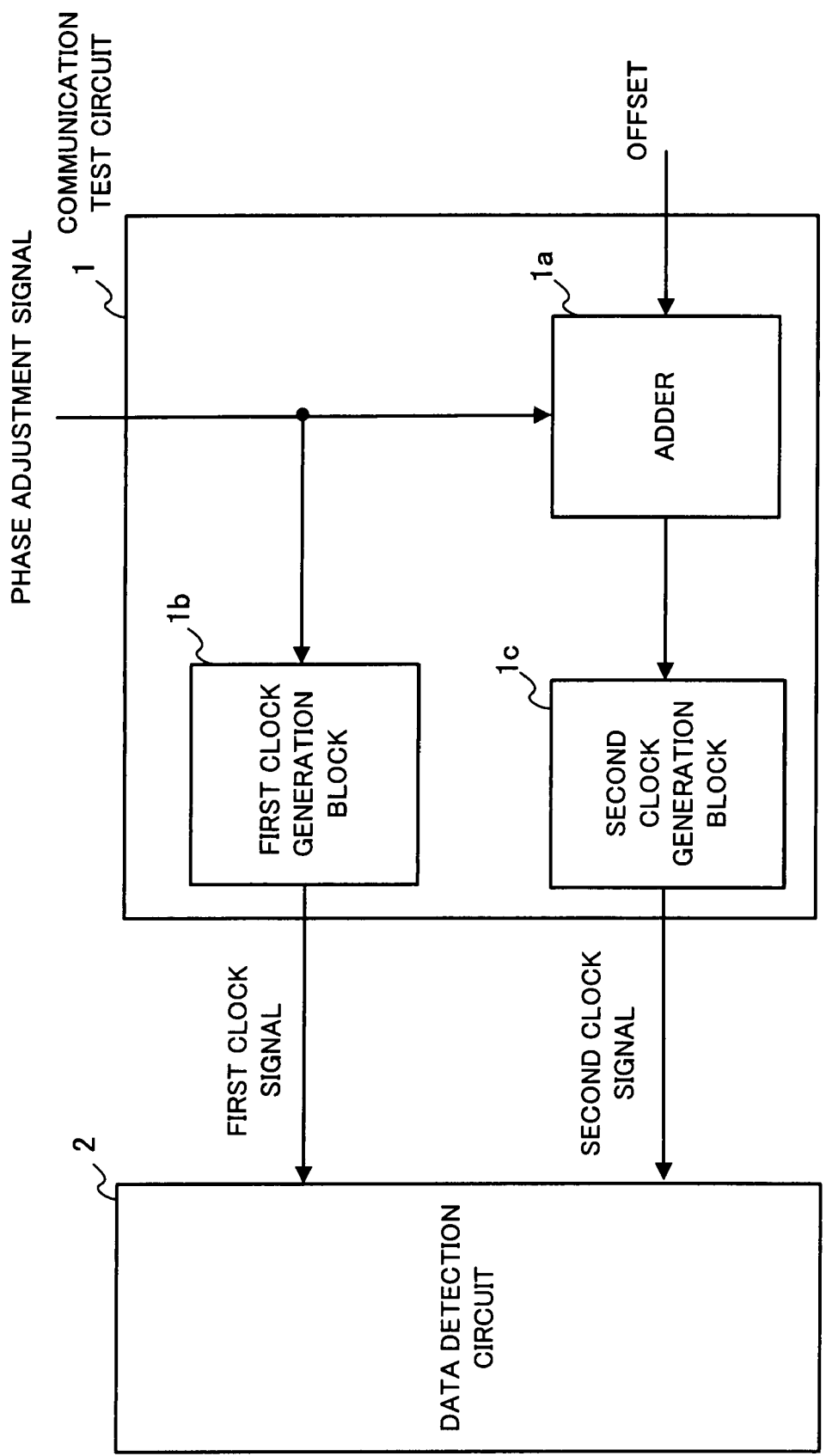
FIG. 1 is a conceptual diagram of the present invention applied to embodiments.

FIG. 1 is a conceptual diagram of the present invention applied to the embodiments.

A communication test circuit 1 according to the present invention includes an adder 1a, a first clock generation block 1b, and a second clock generation block 1c, generates a data detection clock signal and a boundary detection clock signal in accordance with a phase adjustment signal calculated from a received data signal, and outputs the signals to a data detection circuit 2.

The adder 1a receives a prescribed offset and the phase adjustment signal, which adjusts the phases of the boundary detection clock signal and the data detection clock signal in accordance with variations in phase of the received signal, adds the offset to the phase adjustment signal, and outputs an offset phase adjustment signal to the second clock generation block 1c. If the offset is zero, the phase adjustment signal is output directly to the second clock generation block 1c.

The first clock generation block 1b receives the phase adjustment signal and outputs a first clock signal with its phase adjusted in accordance with the phase adjustment signal to the data detection circuit 2. The first clock generation block 1b inputs the first clock signal to the data detection circuit 2 either as the boundary detection clock signal, which determines a boundary detection timing for detecting a data transition point of the received signal or as the data detection clock signal, which determines a data detection timing for detecting data of the received signal.

The second clock generation block 1c generates a second clock signal in accordance with the offset phase adjustment signal input from the adder 1a. Because the offset phase adjustment signal is input, the generated second clock signal contains a displacement along the time axis in accordance with the offset, in comparison with what the natural second clock signal should be. The second clock generation block 1c inputs the second clock signal to the data detection circuit 2, as a clock signal differing from that input from the first clock generation block 1b. If the first clock signal generated by the first clock generation block 1b serves as the boundary detection clock signal, the second clock signal serves as the data detection clock signal. If the first clock signal generated by the first clock generation block 1b serves as the data detection clock signal, the second clock signal serves as the boundary detection clock signal.

The data detection circuit 2 performs data detection processing for detecting data from the received signal in accordance with the boundary detection clock signal and the data detection clock signal, which are the first clock signal and the second clock signal.

The operation of the communication test circuit 1 and the data detection circuit 2, structured as described above, will next be described.

A CDR circuit, which is not shown in the figure, compares an edge of the boundary detection clock signal and a data transition point of the received data signal and calculates the phase adjustment signal, which performs phase adjustment to bring the edge of the boundary detection clock signal to the data transition point of the received data signal.

The phase adjustment signal is directly input to the first clock generation block 1b, and the first clock signal with its phase adjusted in accordance with the phase adjustment signal is output to the data detection circuit 2. The adder 1a obtains the offset phase adjustment signal by adding the prescribed offset to the phase adjustment signal and outputs the offset phase adjustment signal to the second clock generation block 1c. The second clock generation block 1c outputs the second clock signal with its phase adjusted in accordance with the offset phase adjustment signal to the data detection circuit 2.

When the data detection circuit 2 uses the first clock signal as the boundary detection clock signal and the second clock signal as the data detection clock signal, the edge of the boundary detection clock signal agrees with the transition point of the received data. An edge of the data detection clock signal adjusted in accordance with the offset phase adjustment signal moves from the center of the boundary detection clock signal to a position determined by the offset. With this, a range (noise margin) in which data detection latch is possible is tested, allowing the permissible range of jitter to be indirectly ensured.

When the data detection circuit 2 uses the first clock signal as the data detection clock signal and the second clock signal as the boundary detection clock signal, the edge of the boundary detection clock signal shifts from the transition point of the received data. This moves the boundary detection timing to be referenced in generation of the phase adjustment signal, producing the same advantage as described above.

If the offset is zero in the normal state, the offset phase adjustment signal input to the second clock generation block 1c through the adder 1a matches the phase adjustment signal input to the first clock generation block 1b. Accordingly, like the first clock generation block 1b, the second clock generation block 1c can adjust the phase of the second clock signal in accordance with the phase adjustment signal. This aligns the edge of the data detection clock signal with the center of the boundary detection clock signal in the data detection circuit 2. The boundary detection clock signal and the data detection clock signal are adjusted as described above to make the timing of detection of the received data appropriate for the received data signal.

The above-described operation will be described with reference to waveforms of the received data signal.

Figure 2A:
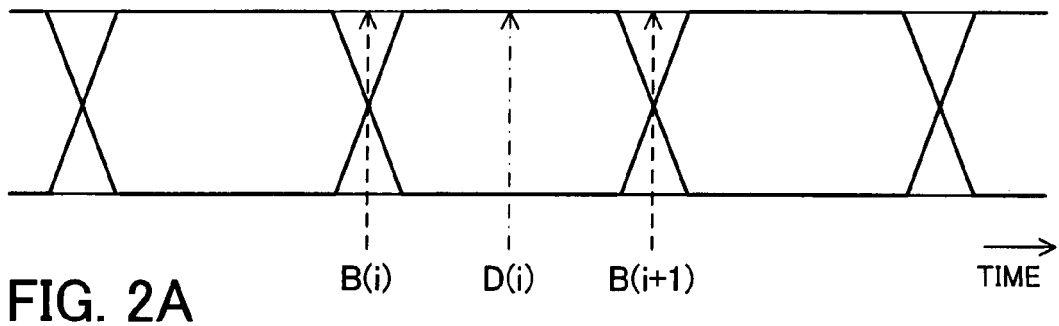
FIGS. 2A, 2B, and 2C are views showing received data signal waveforms.
Figure 2B:
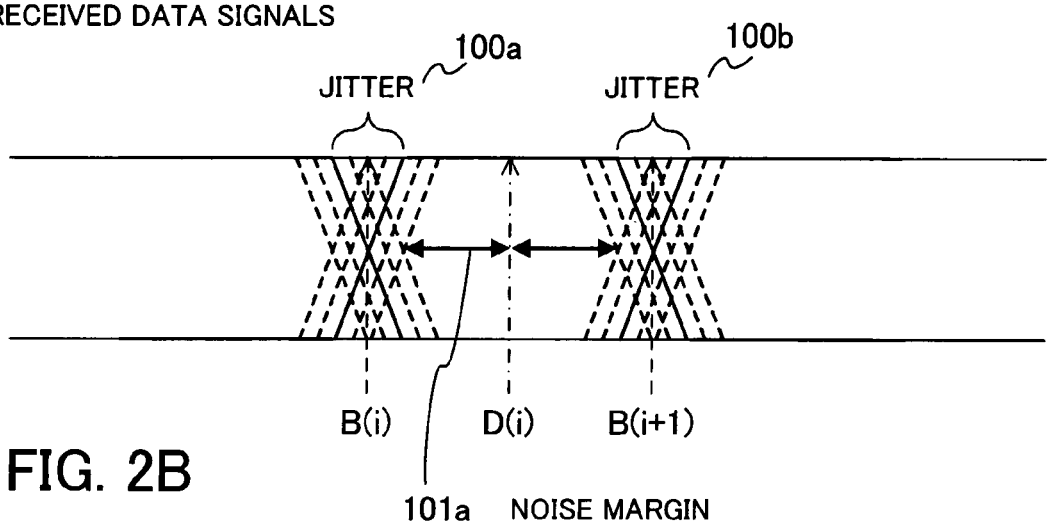
Figure 2C:
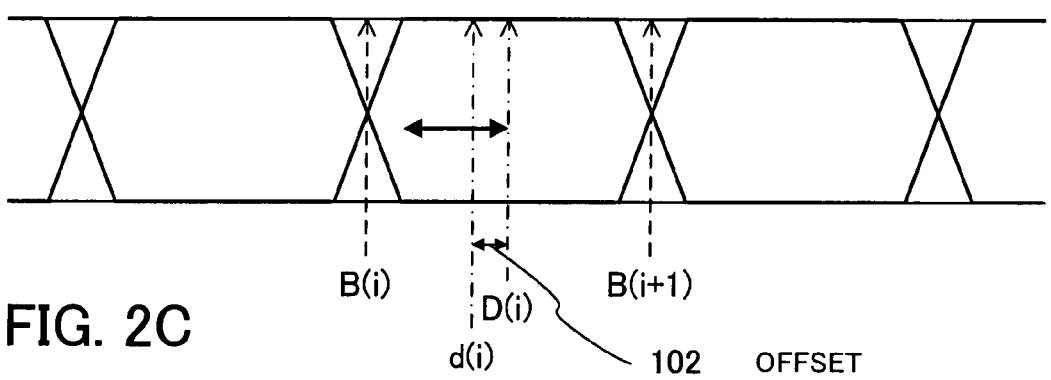

FIGS. 2A, 2B, and 2C are views showing received data signal waveforms. FIG. 2A shows the waveform of the received data signal; FIG. 2B shows superimposed waveforms of the received data signals; and FIG. 2C shows a signal waveform at a test. The time axis lies in the horizontal direction of the figure, and time passes from left to right.

As the waveform of the received data signal in FIG. 2A shows, the received data signal is a differential signal of a pair of received data signals having alternating phases. To detect a data transition point, or a boundary on which the signal waveforms cross each other, the boundary detection clock signal is generated such that an edge of the boundary detection clock signal is aligned with the data transition point. In the figure, an adjustment is made to align edges of the boundary detection clock signal with B(i) and B(i+1). The data detection clock signal is adjusted to align its edge with the midpoint between two edges of the boundary detection clock signal, so that the data can be detected. In the figure, the adjustment is made to align the edge of the data detection clock signal with the midpoint D(i) between B(i) and B(i+1).

The superimposed waveforms of the received data signals shown in FIG. 2B are the waveforms of a plurality of received data signals superimposed about the edge D(i) of the data detection clock signal. The boundary detection clock signal and the data detection clock signal are adjusted in accordance with the input received data signal with data transition points of the data signal to be received subsequently being predicted. Ideally, the superimposed waveforms of all the received data signals should agree with each other. The actual received data signals, however, contain jitter 100a and 100b, which are noise components along the time axis. This results in the difference between the edges B(i) and B(i+1) of the boundary detection clock signal and the data transition points of the actual received data signals, indicated by dotted lines. Accordingly, the jitter tolerance can be tested indirectly by evaluating a noise margin 101a.

The waveform at a test in FIG. 2C represents relationships among the waveform of the received data signal used when a jitter tolerance test is performed, the edges B(i) and B(i+1) of the boundary detection clock signal, and the edge d(i) of the data detection clock signal. The data detection clock signal is generated by adding an offset to the phase adjustment signal by means of the adder 1a. The second clock generation block (for data detection) 1c generates a data detection clock signal by shifting the edge D(i) of the natural data detection clock signal by an offset 102 on the time axis, determined by the added offset. This is the same as shifting the transition point of the received data signal by the offset 102 because of jitter. Therefore, the jitter tolerance test can be carried out by specifying the offset 102 to an appropriate value.

A communication interface circuit for restoring clock from a received data signal formed by a two-phase differential signal and extracting data from the received data signal, according to an embodiment of the present invention, will be described below in detail with reference to figures.

Figure 3:
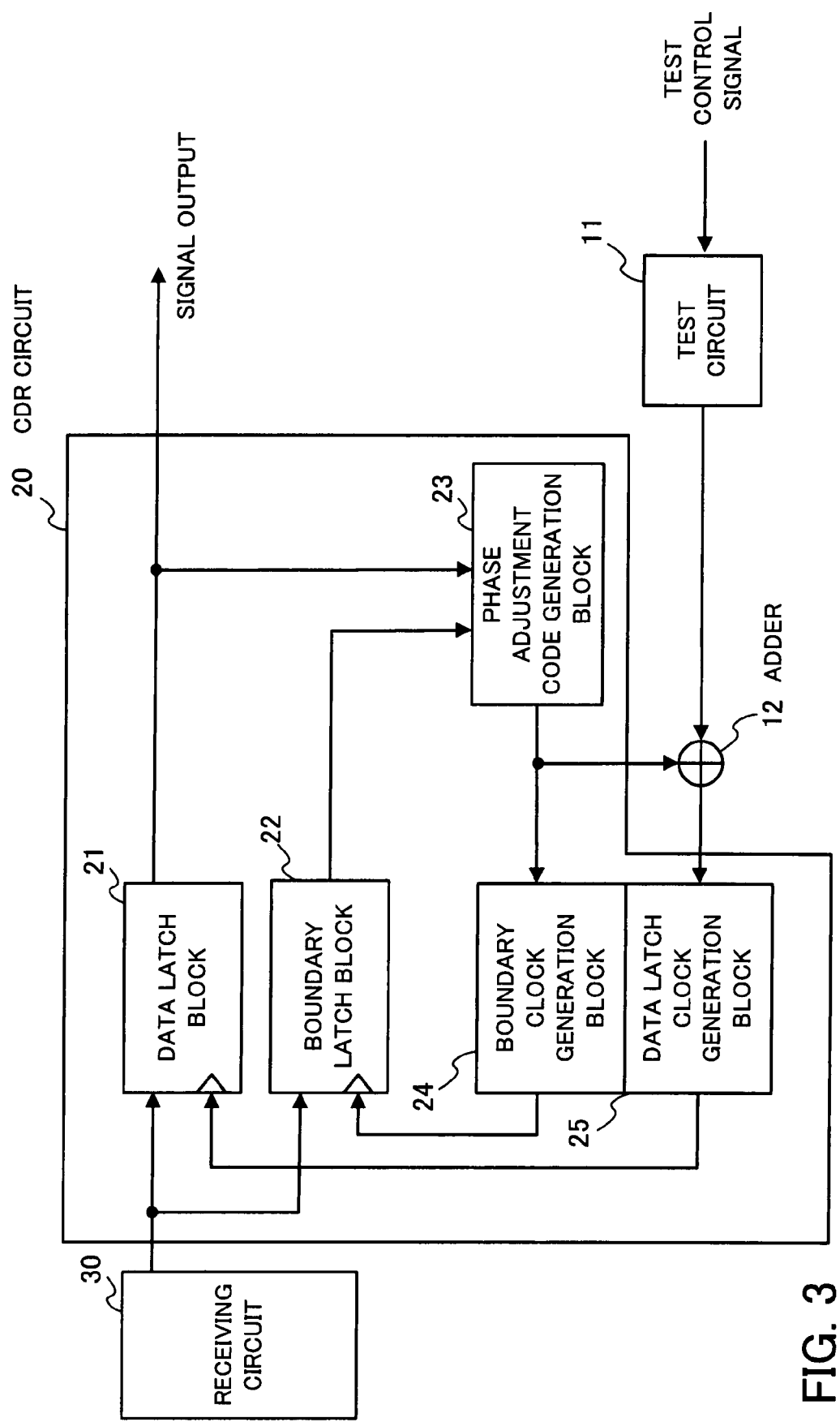
FIG. 3 is a block diagram of a communication interface circuit of an embodiment of the present invention.

FIG. 3 is a block diagram of the communication interface circuit of the embodiment of the present invention. For the sake of simplicity, a first clock generation block is described as a boundary clock generation block in a CDR circuit 20, and a second clock generation block is described as a data latch clock generation block in the CDR circuit 20. This structure can be modified as appropriate in accordance with an application form.

The communication interface circuit of the embodiment of the present invention includes a test circuit 11 and an adder 12 both used for adding a test offset amount to a phase adjustment amount at a test; a CDR circuit 20 formed of a data latch block 21, a boundary latch block 22, a phase adjustment code generation block 23, a boundary clock generation block 24, and a data latch clock generation block 25; and a receiving circuit 30.

The test circuit 11 receives a test control signal and outputs an offset or a test code to the adder 12 in a test. Not in a test, the test circuit 11 outputs zero as an offset or a test code for not executing a test. The test circuit 11 functions as a selector.

The adder 12 adds a phase adjustment code generated by the phase adjustment code generation block 23 and the offset specified by the test circuit 11 and outputs the result to the data latch clock generation block 25. This offset can be a test code specifying an offset value. If the offset is a test code, an offset value corresponding to each test code is specified and added to the phase adjustment code. Alternatively, the test code may be added to the phase adjustment code, the result being output and later converted by the data latch clock generation block 25. If the offset is zero, the phase adjustment code is output directly.

The CDR circuit 20 carries out phase adjustment for a boundary detection clock signal (hereafter referred to as a boundary clock signal) and a data detection clock signal (hereafter referred to as a data latch clock signal) with a feedback of phase differences from the actual received data signal. The data latch block 21 latches data in the received data signal in accordance with the data latch clock signal generated by the data latch clock generation block 25. The boundary latch block 22 latches a boundary of the received data signal in accordance with the boundary clock signal generated by the boundary clock generation block 24. The phase adjustment code generation block 23 compares a data transition point of the received data signal and the latch timing of the boundary latch block 22 and generates a phase adjustment code for adjusting the phase of the boundary clock signal. The boundary clock generation block 24 adjusts the phase of the boundary clock signal in accordance with the phase adjustment code. The data latch clock generation block 25 adjusts the phase of the data latch clock signal in accordance with an offset phase adjustment code or the phase adjustment code input through the adder 12.

The receiving circuit 30 receives a signal input from the outside and outputs the signal as the received data signal to the CDR circuit 20.

FIG. 3 shows just an example structure, and the structure can be modified appropriately within the scope of the present invention. For instance, the adder 12 may be included in the circuit block of the phase adjustment code generation block 23. External input data can be received directly by a latch block, without the receiving circuit 30.

In a normal state, or while no test is performed, in the communication interface circuit, the receiving circuit 30 receives a signal sent from the outside and outputs the signal as the received data signal to the CDR circuit 20. In the CDR circuit 20, phase adjustment is carried out in accordance with the received data signal so that an edge of the boundary detection clock signal for creating a boundary detection timing is aligned with a data transition point, and an edge of the data detection clock signal for creating a data detection timing is aligned with the midpoint between two edges of the boundary clock signal.

When a test starts as specified by a tester or the like, the test circuit 11 outputs a test code for determining an offset to the adder 12. The adder 12 adds the test code or the offset determined by the test code to the phase adjustment code and outputs the result to the data latch clock generation block 25. The data latch clock generation block 25 adjusts the phase of the data latch clock signal in accordance with the phase adjustment code obtained by adding the test code. The boundary clock generation block 24 adjusts the phase of the boundary clock signal in accordance with the phase adjustment code generated by the phase adjustment code generation block 23. Accordingly, the edge of the data latch clock signal is shifted from the midpoint between two edges of the boundary clock signal to a position determined by the test code.

By shifting the edge of the data latch clock signal from the midpoint of the boundary clock signal in this way, a possible latch range can be tested, and the permissible range of jitter can be checked indirectly. The position of the edge of the data latch clock signal can be specified at any position by adjusting the test code in a test. Accordingly, an appropriate test code for the testing environment or for macro characteristics can be selected after the actual chip is completed and put into the mass production stage.

The edge of the data latch clock signal is specified at any position in the circuit to provide dummy jitter. Therefore, the test can be carried out adequately by a general tester, without using an expensive tester that can generate jitter. The data rate does not need to be maximum, and a data rate at which the CDR circuit can lock the timing would be fine. Therefore, an inexpensive tester can generate input data. At a test, the tester generates serial data having a "0101" data pattern and inputs the data to the target communication interface circuit, in order to eliminate the effect of the characteristics of the board.

As has been described above, according to the present invention, a jitter tolerance test in mass production can be carried out in a testing environment using a general tester.

The test may be carried out without a tester. A sending circuit of the high-speed serial interface on the same chip may output a "0101" pattern, and the output signal is sent back to the receiving circuit on the internal circuit or on the test board.

A communication test method, according to an embodiment of the present invention, for carrying out a test by using the above-described communication interface circuit will next be described.

Figure 4:
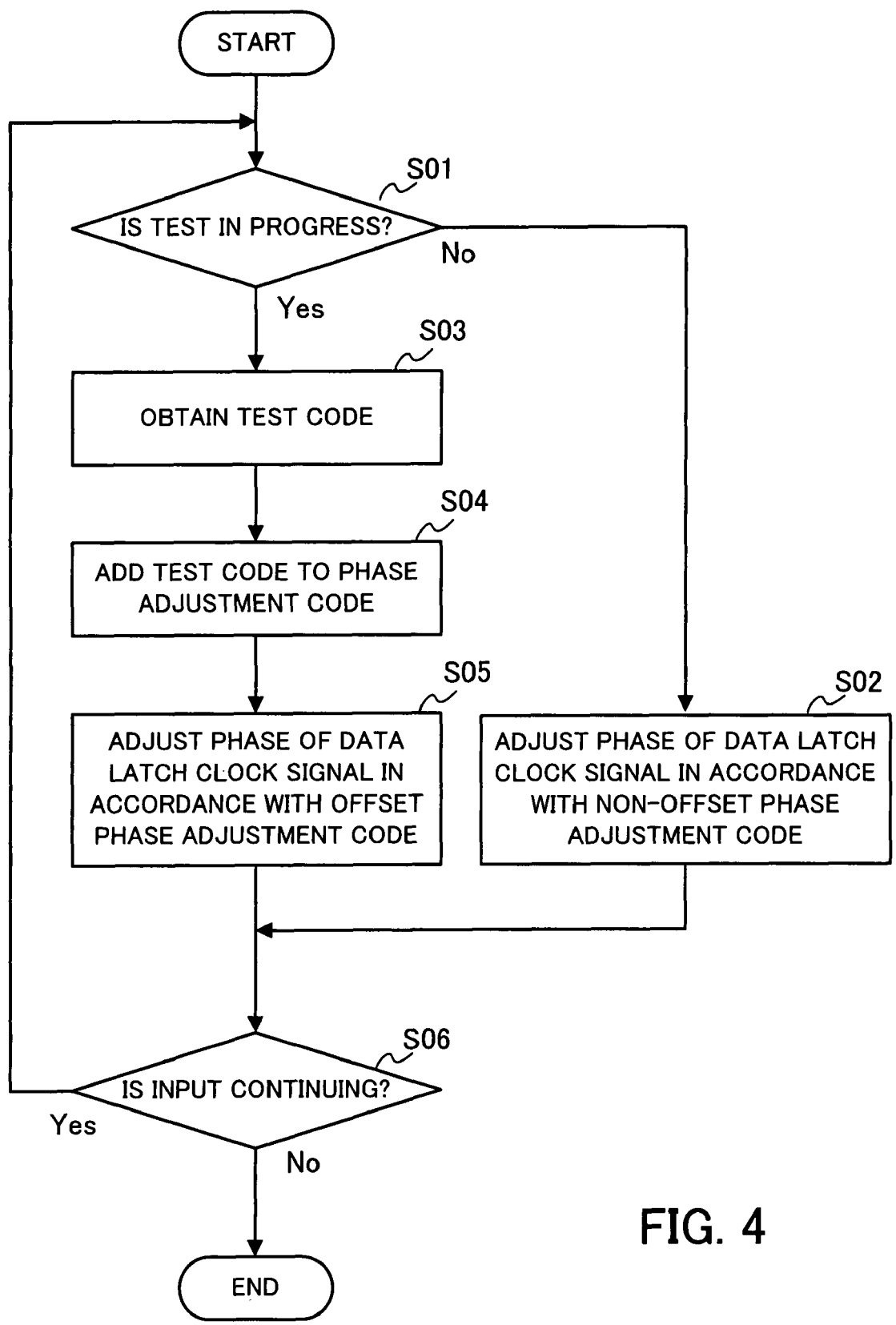
FIG. 4 is a flow chart showing an example processing procedure of a communication test method of an embodiment of the present invention.
Figure 5:
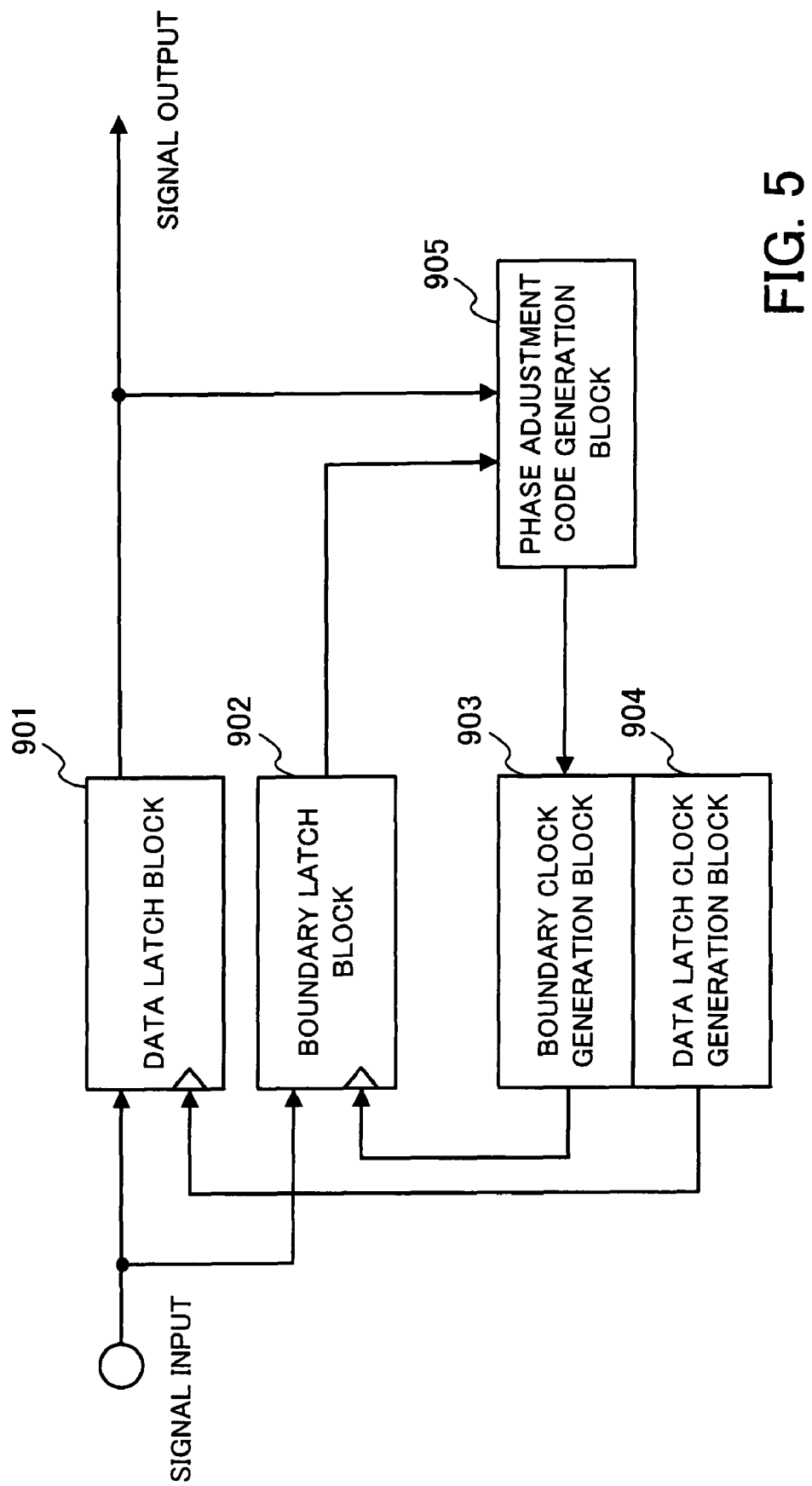
FIG. 5 is a block diagram showing an example structure of a conventional CDR circuit.

FIG. 4 is a flow chart showing an example processing procedure of the communication test method. The processing starts when the receiving circuit starts receiving a signal.

Step S01: It is judged whether a test is in progress. This judgment is made on the basis of a test control signal input from an external tester or the like. If no test is in progress, the processing proceeds to step S02. If a test is in progress, the processing proceeds to step S03.

Step S02: If no test is in progress, the phase of the data latch clock signal is adjusted in accordance with a non-offset phase adjustment code calculated by the phase adjustment code generation block 23, and the data latch clock signal is output. Then, the processing proceeds to step S06. Accordingly, if not in the test state, the phase of the data latch clock signal is adjusted to align its edge with the midpoint between two edges of the boundary clock signal, and the resultant signal is output.

Step S03: If a test is in progress, a test code specified by the tester or the like is obtained.

[Step S04] The phase adjustment amount calculated by the phase adjustment code generation block 23 and the test code obtained in step S03 are added to obtain an offset phase adjustment code.

Step S05: The phase of the data latch clock signal is adjusted in accordance with the offset phase adjustment code obtained in step S04, and the data latch clock signal is output. Then, the processing proceeds to step S06. Accordingly, in the test state, the phase of the data latch clock signal is adjusted to shift its edge from the midpoint between two edges of the boundary clock signal to a position determined by the offset, and the resultant signal is output.

Step S06: It is checked whether the input is continuing. If the input is continuing, the phase adjustment processing returns to step S01 and continues. If the input has ended, the processing ends.

By executing the processing procedure described above, a margin test can be carried out to check whether the received data can be detected after the edge of the data latch clock signal is moved from the center of the boundary clock signal to any position in a test. In addition, an indirect jitter tolerance test can be carried out.

In the description given above, the test mode starts after the timing is first locked by the CDR circuit, but the test mode may start first. In that case, the operation starts with the offset specified beforehand. This makes it possible to test whether data can be received normally with the timing locked by the CDR circuit while jitter is present.

A communication test circuit of the present invention can shift a natural data detection timing with respect to the received signal in accordance with a prescribed offset by adding the offset to a phase adjustment signal for adjusting a clock signal specifying the data detection timing. The natural phase relationship between a data detection clock signal and a boundary detection clock signal can be shifted along the time axis in accordance with the offset, by adding the offset to the phase adjustment signal input to a clock generation block for generating the data detection clock signal or the boundary detection clock signal.

The data detection timing is changed by changing the phase of the data detection clock signal or the phase of either the data detection clock signal or the boundary detection clock signal to the phase of the received signal in accordance with the offset, and the range (noise margin) of variations in the data detection timing at which data can be detected can be tested. As a result, the permissible range of jitter is ensured indirectly, which means that a jitter tolerance test has been executed.

A communication interface circuit including the communication test circuit described above and a communication test method therefor according to the present invention allow any difference between the received data signal and the data detection timing to be created in the circuit, enabling the test to be performed without an expensive tester or a complicated external circuit. For instance, a dummy jitter state can be created in the circuit, and a jitter tolerance test can be carried out.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A communication test circuit for testing a communication interface circuit which restores a clock signal from a received signal and detects data, the communication test circuit comprising:
   an adder that receives a phase adjustment signal for adjusting a data detection timing at which the data is detected from the received signal, in accordance with a phase of the received signal, and a prescribed offset, and calculates an offset phase adjustment signal by adding the offset to the phase adjustment signal; and
   a clock generation block that receives the offset phase adjustment signal calculated by the adder and outputs the clock signal adjusted in accordance with the offset phase adjustment signal,
   wherein the adder receives the offset as a test code that can be variably specified from an outside and specifies an offset value to be added to the phase adjustment signal in accordance with the test code.

2. The communication test circuit according to claim 1, further comprising a selector that outputs the offset when test information indicates that a test is in progress, and outputs zero as the offset when the test information indicates that no test is in progress.

3. A communication test circuit for testing a communication interface circuit which restores a first clock signal and a second clock signal from a received signal and detects data, the communication test circuit comprising:
   an adder that receives a prescribed offset and a phase adjustment signal specifying phase adjustment in accordance with the received signal, with respect to the first clock signal determining either one timing of a boundary detection timing for detecting a transition point of the data from the received signal and a data detection timing for detecting the data from the received signal, and the second clock signal determining another timing, and calculates an offset phase adjustment signal by adding the offset to the phase adjustment signal;
   a first clock generation block that receives the phase adjustment signal directly and outputs the first clock signal, a phase of which is adjusted in accordance with the phase adjustment signal; and
   a second clock generation block that receives the offset phase adjustment signal with the offset added by the adder and outputs the second clock signal, a phase of which is adjusted in accordance with the offset phase adjustment signal.

4. The communication test circuit according to claim 3, wherein the adder receives the offset as a test code which can be variably specified from an outside and specifies an offset value to be added to the phase adjustment signal in accordance with the test code.

5. The communication test circuit according to claim 3, further comprising a selector that outputs the offset when test information indicates that a test is in progress, and outputs zero as the offset when the test information indicates that no test is in progress.

6. A communication interface circuit for restoring a first clock signal and a second clock signal from a received signal and detecting data, the communication interface circuit comprising:
   a phase adjustment signal generation block that generates, in accordance with the received signal, a phase adjustment signal for adjusting, in accordance with variations in phase of the received signal, the first clock signal determining either one timing of a boundary detection timing for detecting a transition point of the data from the received signal and a data detection timing for detecting the data from the received signal, and the second clock signal determining another timing;
   an adder that receives the phase adjustment signal and a prescribed offset and calculates an offset phase adjustment signal by adding the offset to the phase adjustment signal;
   a first clock generation block that receives the phase adjustment signal directly and outputs the first clock signal, a phase of which is adjusted in accordance with the phase adjustment signal;

a second clock generation block that receives the offset phase adjustment signal with the offset added by the adder, and outputs the second clock signal, a phase of which is adjusted in accordance with the offset phase adjustment signal; and a data detection block that detects the data from the received signal in accordance with the data detection timing determined by one of the second clock signal and the first clock signal.

7. A communication test method for testing a communication interface circuit which restores a first clock signal and a second clock signal from a received signal and detects data, the communication test method comprising:

receiving a phase adjustment signal for specifying phase adjustment in accordance with the received signal, with respect to the first clock signal determining either one timing of a boundary detection timing for detecting a transition point of the data from the received signal and a data detection timing for detecting the data from the received signal, and the second clock signal determining another timing, also receiving a prescribed offset at a test;

calculating an offset phase adjustment signal by adding the offset to the phase adjustment signal;

adjusting a phase of the first clock signal in accordance with the phase adjustment signal;

adjusting a phase of the second clock signal in accordance with the offset phase adjustment signal; and shifting either one of the data detection timing and the boundary detection timing from the timing determined by the received signal.

* * * * *